United States Patent [19]

Jung et al.

[11] Patent Number: 5,796,273

[45] Date of Patent: Aug. 18, 1998

[54] SENSE AMPLIFIER FOR SEMICONDUCTOR MEMORY DEVICE

[75] Inventors: Tae-Sung Jung, Gunpo; Jung-Hoon Park, Ahnyang, both of Rep. of Korea

[73] Assignee: Samsung Electronics, Co., Ltd., Suwon, Japan

[21] Appl. No.: 650,399

[22] Filed: May 20, 1996

[30] Foreign Application Priority Data

May 20, 1995 [KR] Rep. of Korea ............... 12691/1995

[51] Int. Cl.⁶ ................................................ G01R 19/00
[52] U.S. Cl. .................................... 327/55; 327/57
[58] Field of Search .......................... 327/51–57, 65, 327/67, 77, 560–563; 365/189.21

[56] References Cited

U.S. PATENT DOCUMENTS

| | | | |
|---|---|---|---|
| 4,333,025 | 6/1982 | Domogalla | 327/67 |
| 4,551,641 | 11/1985 | Pelley, III | 327/55 |
| 4,558,241 | 12/1985 | Suzuki et al. | 327/57 |
| 4,743,784 | 5/1988 | Obara et al. | 327/57 |
| 4,894,559 | 1/1990 | Kanebo | 327/57 |
| 5,148,063 | 9/1992 | Hotta | 327/56 |
| 5,162,681 | 11/1992 | Lee | 327/55 |

*Primary Examiner*—Toan Tran
*Attorney, Agent, or Firm*—Marger, Johnson, McCollom & Stolowitz, P.C.

[57] ABSTRACT

A sense amplifier has a pair of output terminals and a first pair of pull-up transistors. A second pair of transistors is connected between the output terminals and a pull-down node. The gate electrodes of the second pair are cross-coupled to the output terminals. A third pair of transistors is connected between the output terminals and the pull-down node and have gate electrodes coupled to input potentials. A fourth pair of transistors is connected between the output terminals and the pull-down node and also have gate electrodes coupled to input potentials.

25 Claims, 2 Drawing Sheets

SENSE AMPLIFIER FOR SEMICONDUCTOR MEMORY DEVICE

BACKGROUND OF THE INVENTION

1. Field of the Invention

The present invention relates to a sense amplifier which senses and amplifies a voltage level of data stored in memory cells within a semiconductor memory device, and more particularly to a sense amplifier which has a wide input range, being employed in a nonvolatile semiconductor memory having memory cells capable of storing a more than two data levels as well as binary logic data. The present application is based upon Korean Application No. 12691/1995, which is incorporated herein by reference.

2. Description of the Related Art

With the development of manufacturing technologies, semiconductor memory devices have advanced in various manners. For example, there have been attempts to develop improved types of sense amplifiers while maintaining high density of memory cells and high speed operation of devices. Various types of sense amplifiers, which sense and then amplify a voltage level of data read-out from memory cells, have been developed.

One conventional sense amplifier, for example, is capable of executing a sensing operation only in the event that a voltage level of an input signal is higher than a threshold voltage level of an N-channel transistor connected to an input terminal of the sense amplifier. Therefore the sense amplifier cannot implement the sensing operation for an input signal having a voltage level lower than the threshold voltage level of the N-channel transistor. Moreover, in the event that a high level input signal approximating a power supply voltage level is applied to the input terminal of the sense amplifier, a load transistor (typically, a P-channel transistor) and an input transistor (typically, an N-channel transistor) simultaneously draw a large amount of current. This prevents the output level of the sense amplifier from reaching higher than substantially 70 to 80% of the power supply voltage level.

Accordingly, there is a problem in that the voltage range applicable to the input terminal of the sense amplifier is not sufficient. Specifically, when such a conventional sense amplifier is employed in a multi-level memory device capable of storing a plurality of bits in a single memory cell, the range of possible voltages between different levels stored in the memory cell is accordingly reduced.

As shown in FIG. 1, separate sense amplifiers each adapted to be used in a corresponding input range are provided to solve the above-described problem arising in a conventional sense amplifier. This, however, results in increasing the area occupied by the sense amplifiers in the memory device, so that a high density memory device may not be achieved. For better understanding of the present invention, the circuit configuration of a conventional sense amplifier will be discussed with reference to FIG. 1.

FIG. 1 is a circuit diagram illustrating a conventional sense amplifier, which is used in a read only memory (ROM) device where a plurality of bits are stored in a single memory cell. Reference voltages having different levels, such as, for example, REF1, REF2 and REF3 are each applied to non-inverting input terminals of sense amplifiers 31, 32 and 33, which sense amplifiers are included in a sense amplifying circuit 30. A bit line voltage VB as a common input signal determined by a memory cell array and a pull up circuit 20 is applied to each of inverting input terminals on amplifiers 31, 32, 33. The sense amplifiers simultaneously perform a sensing operation by comparing the bit line voltage VB with each of the reference voltages REF3, REF2 and REF1. Outputs of these sense amplifiers are produced as most significant bit (MSB) and least significant bit (LSB) as a result of encoding logic 40 on input/output terminals 50, 51, respectively.

The conventional sense amplifier must include multiple sense amplifiers and encoding logic for sensing a multiple data levels, as shown in FIG. 1. Therefore, when the sense amplifiers are embodied on a single chip within a semiconductor integrated circuit, the area occupied by the sense amplifiers is increased. Moreover, in the event that the sense amplifier is applied in a nonvolatile semiconductor memory device having a page structure, such as, a NAND-type flash EEPROM (electrically erasable and programmable read only memory) which requires a sense amplifier for each bit line or several bit lines, the increase in chip size may be substantial.

SUMMARY OF THE INVENTION

Accordingly, it is an object of the present invention to provide an improved sense amplifier which is free from the above-mentioned problems.

It is another object of the present invention to provide a sense amplifier which is capable of performing a sensing operation for a data input signal having any level between a ground potential and a power supply voltage.

It is yet another object of the present invention to provide a sense amplifier which is capable of performing a sequential sensing operation for a multiple data levels using a single sense amplifier to thus minimize the area occupied thereby and which is adapted for use in a semiconductor memory device having a page structure.

It is still another object of the present invention to provide a sense amplifier in which a logic "low" level of an output voltage approximates a ground potential level and a logic "high" level thereof approximates a power supply voltage level.

According to an aspect of the present invention, a sense amplifier having a pair of output terminals and a first pair of pull-up transistors includes a pull-down node; a second pair of transistors connected between the output terminals and the pull-down node and having gate electrodes cross-coupled to the output terminals; a third pair of transistors connected between the output terminals and the pull-down node and having gate electrodes coupled to input potentials; and a fourth pair of transistors connected between the output terminals and the pull-down node and also having gate electrodes coupled to input potentials.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF THE PREFERRED EMBODIMENT

The term "sense amplifier" is used herein to indicate a circuit for sensing a voltage level provided to a data output line of a memory cell within a semiconductor memory device and amplifying the sensed voltage level by a predetermined amplifying ratio and thereafter applying the amplified voltage level to an output buffer. The term "pull-down node" is used herein to refer to a node on which a voltage level can be made substantially equal to a ground potential level as a result of conduction of a pull-down transistor.

Figure 1:
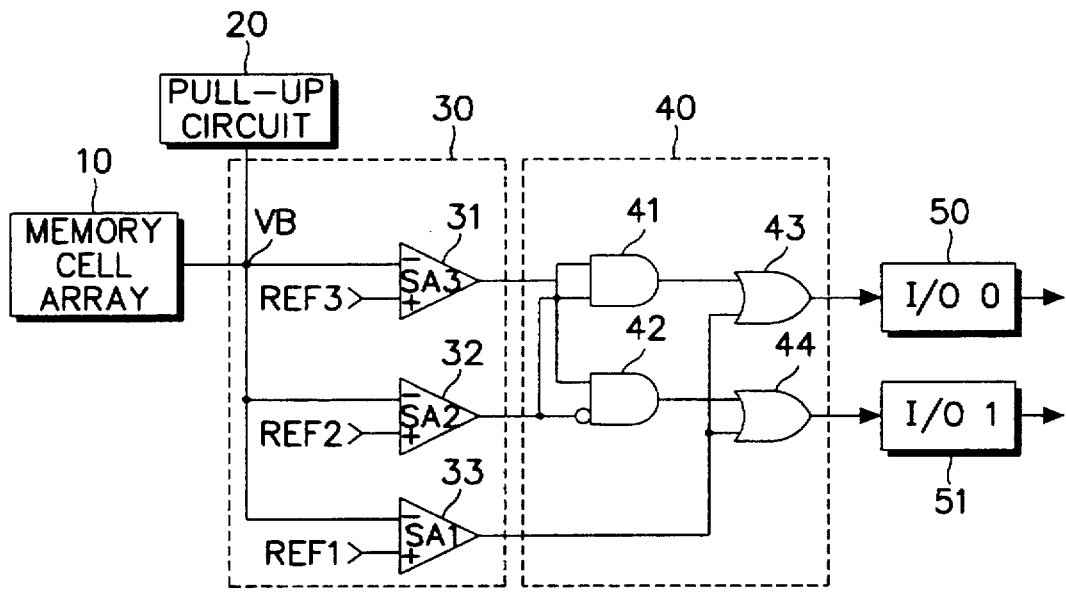
FIG. 1 is a circuit diagram illustrating a conventional sense amplifier having an encoding logic.
Figure 2:
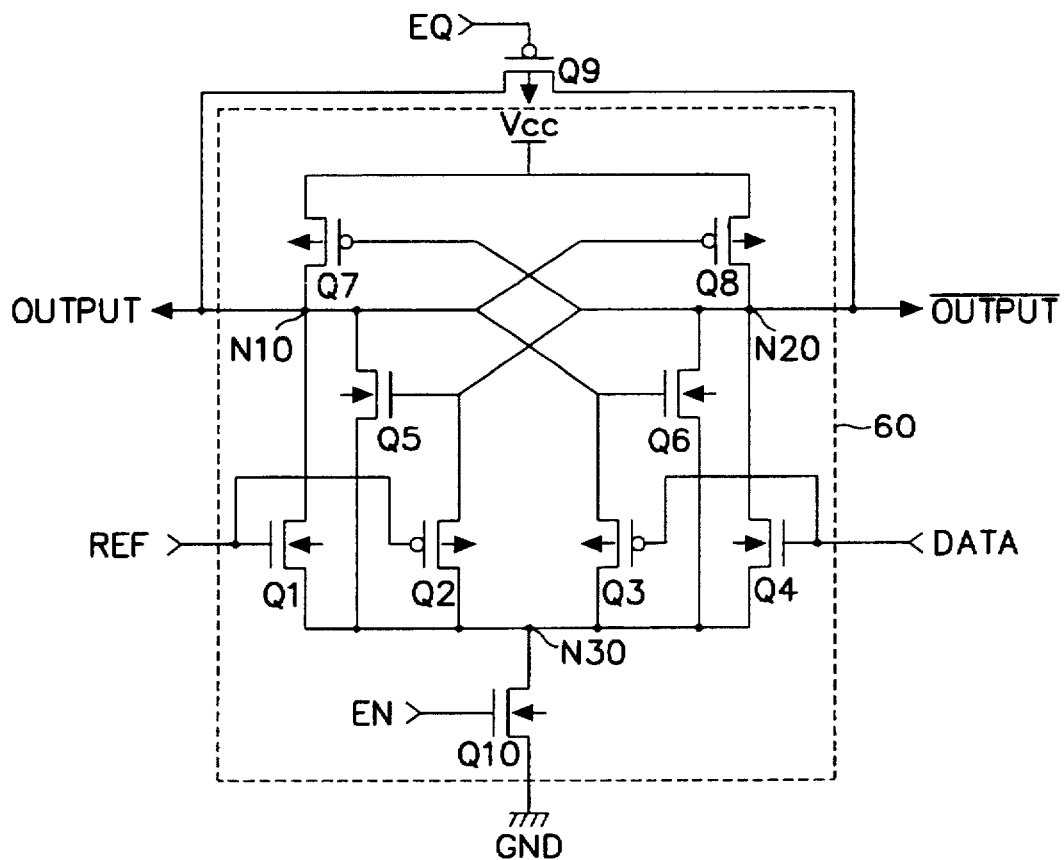
FIG. 2 is a circuit diagram illustrating a circuit of a sense amplifier constructed according to the principles of the present invention.

Referring to FIG. 2, a circuit which may be used in an EEPROM includes a sense amplifier 60 having a latch structure and an equalizing transistor Q9 which has its drain-source path connected between first and second output nodes N10 and N20 and receives an equalizing signal EQ to the gate thereof.

The sense amplifier 60 includes first and second output nodes N10 and N20, and a pull-down node N30. First and second N-channel transistors Q1 and Q5 and a first P-channel transistor Q3 have the drain-source paths thereof respectively connected in parallel between the first output node N10 and the pull-down node N30. Third and fourth N-channel transistors Q4 and Q6 and a second P-channel transistor Q2 have the drain-source paths thereof respectively connected in parallel between the second output node N20 and the pull-down node N30. The gates of the first N-channel transistor Q1 and the second P-channel transistor Q2 are each connected to a reference voltage terminal REF and the gates of the third N-channel transistor Q4 and the first P-channel transistor Q3 are each connected to a data input terminal DATA. The gates of the fourth N-channel transistor Q6 and the second N-channel transistor Q5 are each connected to the first and second output nodes N10 and N20. A pull-down transistor Q10 is responsive to an enable signal EN and has the drain-source path thereof connected between the pull-down node N30 and a ground terminal GND. Third and fourth P-channel transistors Q7 and Q8 are connected between a power supply voltage Vcc and the first and second output nodes N10 and N20 and have the gates thereof each connected to the second and first output nodes N20 and N10.

Figure 3A:
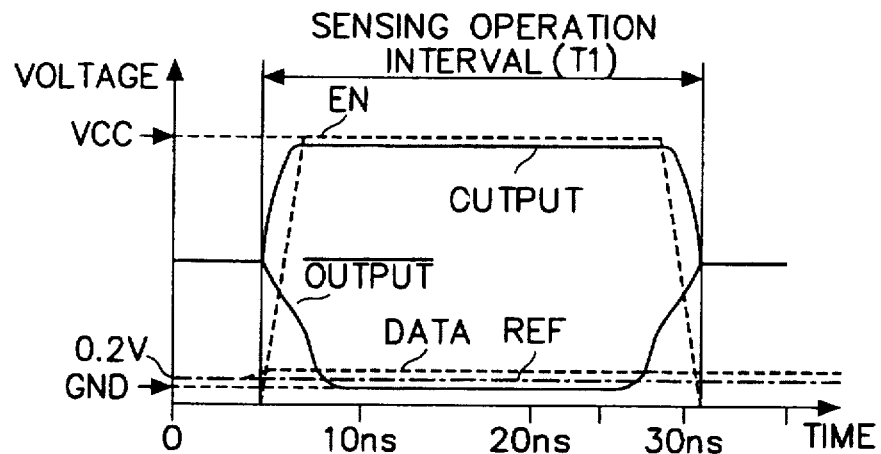
FIGS. 3A to 3C are waveforms illustrating a relationship of voltage versus time of input/output voltage levels during operation of the sense amplifier of FIG. 2.
Figure 3B:
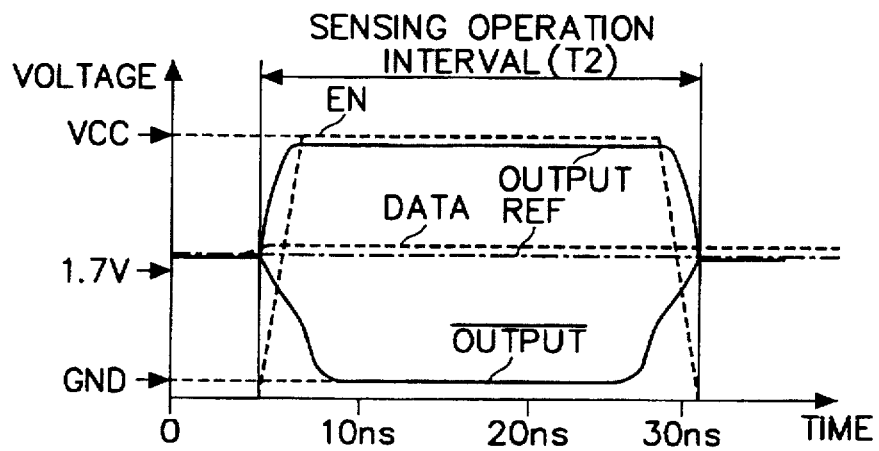
Figure 3C:
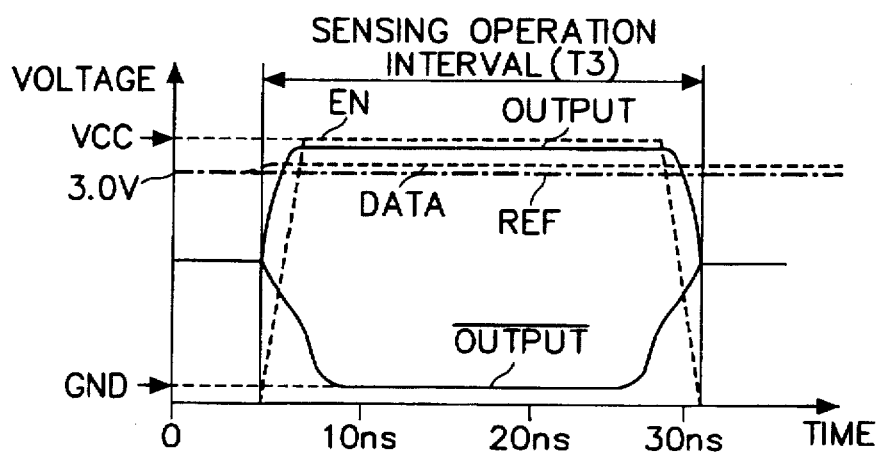

FIGS. 3A to 3C are waveforms illustrating voltage versus time of input/output voltage levels of the sense amplifier in FIG. 2. Operation of the sense amplifier according to the present invention will be explained with reference to FIGS. 2 and 3A to 3C.

Still referring to FIG. 2, because the gates of the first N-channel transistor Q1 and the second P-channel transistor Q2 are each connected to the reference voltage terminal REF and the gates of the third N-channel transistor Q4 and the first P-channel transistor Q3 are each connected to the data input terminal DATA, the sense amplifier 60 can execute a sensing operation even if the power supply voltage Vcc level or the ground potential GND level is applied to the data input terminal DATA. The sensing operation is activated by the enable signal EN going to a logic "high" state.

Assume first that the threshold voltage of the N-channel transistors Q1 and Q4 is Vth(n), and the relationship of Vth(n)<V(REF)<V(DATA) is formed among the reference voltage V(REF), the input data voltage V(DATA) and the threshold voltage Vth(n). When a voltage low enough to turn on P-channel transistors Q2 and Q3, and high enough to turn on transistors Q1 and Q4 is applied to the DATA and REF terminals, the P-channel transistors Q2 and Q3 and N-channel transistors Q1 and Q4 together operate as an input transistor. Such voltages for the DATA and REF terminals are illustrated in FIG. 3B.

When such voltages are applied, and the pull-down transistor Q10 is held on by the enable signal EN, the drain-source paths of N-channel transistors Q1 and Q4 and P-channel transistors Q2 and Q3 each conduct. The output states of first and second output nodes N10 and N20 therefore depend on the amount of current flowing in the pull-down node N30. In this case, since the N-channel transistor Q4 has a larger amount of current than the N-channel transistor Q1 (because V(DATA) is greater than V(REF)) and the P-channel transistor Q2 has a larger amount of current than the P-channel transistor Q3 (also because V(DATA) is greater than V(REF)), the output voltage of the second output terminal N20 has a considerably lower voltage level than the output voltage of the first output terminal N10.

When the output voltage at N20 is lowered, N-channel transistor Q5 is turned off and thus the P-channel transistor Q7 has a larger amount of current than the P-channel transistor Q8, thereby raising the output voltage at N10 to the power supply voltage. As the output voltage at N10 is high, the N-channel transistor Q6 is turned on and the current drawn therethrough takes the output voltage at N20 to ground potential level. FIG. 3B shows the voltage levels in the case where an intermediate voltage level higher than the threshold voltage level of the N-channel transistor and lower than the power supply voltage level is applied as the reference voltage and the input data voltage, respectively.

FIG. 3C shows the voltage level in the case where a high level input amounting to the power supply voltage is applied as the reference voltage and the input data voltage, respectively. With these voltages applied, the P-channel transistors Q2 and Q3 are turned off and the N-channel transistors Q1 and Q4 are turned on and operate as an input transistor. In this case, the logic "high" level of output voltage approximates the power supply voltage level (in case of the power supply voltage of 3.3 volts, the output voltage is 3.25 volts), and the logic "low" level of output voltage becomes the ground potential level, all of which show almost full complementary metal-oxidesemiconductor (CMOS) level.

When the relationship of V(REF)<V(DATA)<Vth(n) is formed among the reference voltage V(REF), the input data voltage V(DATA) and the threshold voltage Vth(n), the circuit operation is as follows. When the pull-down transistor Q10 is turned on by the enable signal EN, the N-channel transistors Q1 and Q4 do not turn on, even though the input signal is applied thereto. Since the P-channel transistor Q2 has a larger amount of current than the P-channel transistor Q3, the output voltage at N20 maintains a considerably lower voltage level than the output voltage at N10. When the output voltage level at N20 is lowered, the N-channel transistor Q5 is turned off and thus the P-channel transistor Q7 has a larger current than the P-channel transistor Q8, thereby raising the output voltage at N10 to the power supply voltage. As the output voltage at N10 is high, the N-channel transistor Q6 turns on and the current drawn therethrough lowers the output voltage at N20 to the ground potential level. A voltage drop for the threshold voltage Vth(n) is not generated in the output voltage at N10 by the N-channel transistors Q5 and Q6, even if the input data voltage V(DATA) has high as the power supply voltage is applied.

FIG. 3A is an input/output waveform showing a computer simulation result obtained correspondingly from the above operation. In a similar manner to FIGS. 3B and 3C, FIG. 3A shows the voltage level, in which when a logic "low" level input voltage amounting to the ground potential level is applied to the data input terminal of the sense amplifier, a logic "high" level of output voltage approximates the power supply voltage level, and a logic "low" level of output voltage approximates the ground potential level.

When an input voltage lower than the threshold voltages of the N-channel transistors Q1 and Q4 is applied, in the event that the output voltages at N10 or N20 goes from the logic "low" level to the logic "high" level, a high level of voltage amounting to the power supply voltage can be obtained, without using the N-channel transistor Q5 or the N-channel transistor Q6. On the other hand, in the event that the output voltage at N10 or N20 goes from the logic "high" level to the logic "low" level, because N-channel transistors Q1 and Q4 are off, only the P-channel transistors Q2 and Q3 draw current. The output voltage at N10 or N20 therefore does not fall to the ground potential level but rather to the level of "[threshold voltage of P-channel transistor Q3]+ input data voltage V(DATA)" or "[threshold voltage of P-channel transistor Q2]+reference voltage V(REF)". Transistors Q5 and Q6 are thus provided to lower a logic "low" level output voltage at N10 or N20, respectively, to the ground potential level.

When an input voltage higher than the threshold voltages of the N-channel transistors Q1 and Q4 is applied, the feedback loop of "N10-Q8-N20-Q5" or "N20-Q7-N10-Q6" is formed. When so operating, the P-channel transistors Q7 and Q8 function to raise any one level of the output voltages at N 10 and N20 to the power supply voltage level in the same manner as a typical latch-type sense amplifier. Further, the N-channel transistors Q5 and Q6, together with the N-channel transistors Q1 and Q4, function to lower any one level of the output voltages at N10 and N20 to the ground potential level. Thus, the output voltages at N10 and N20 are at either the power supply voltage level or the ground potential level. The CMOS level output obtained in the above manner ensures a sufficient sensing margin irrespective of the variation of the power supply voltage, since the circuit input terminal connected to the output terminal of the sense amplifier is stable for the input voltage of the logic "high" or "low" level. The simulation results of an embodiment of the present invention provided a sensing margin of several millivolts.

P-channel transistor Q9 acts as an equalizing circuit and receives equalizing signal EQ at the gate thereof. The source of Q9 is connected to N20 and the drain to N10. When the equalizing signal EQ is at a logic "low" state, the output voltages at N10 and N20 are equalized thereby increasing sensing speed. If transistor Q9 was not provided, when the output voltage at N10 goes to the power supply voltage level, the time to go to the ground potential is lengthened. However, P-channel transistor Q9 enables the output voltages at N10 and N20 to be at an intermediate level between the power supply voltage level and the ground potential level. Therefore, when the voltage level changes from a logic "high" state to a logic "low" state or from a logic "low" state to a logic "high" state, sensing speed increases.

As discussed above, the present invention provides an improved sense amplifier which has a wide input range, when applied to a multi-level sensing memory device, and thus is capable of sequentially sensing multi-level bits stored in a memory cell by using a single sense amplifier. Moreover, the sense amplifier according to the present invention is advantageous in reducing the area occupied thereby when embodied in an integrated circuit.

Furthermore, the sense amplifier according to the present invention may be of course embodied in a multi-level flash memory device storing two or more bits of information in a single memory cell.

While the present invention has been described above with reference to the preferred embodiment, it will be appreciated by those skilled in the art that various substitutions and modifications can be made without departing from the spirit and scope of the invention as set forth in the following claims.

We claim:

1. A sense amplifier comprising:
   a first pair of cross-coupled P-type transistors connected to a pair of output lines;
   a second pair of cross-coupled N-type transistors operatively connected to said first pair, said first and second pairs latching a voltage level responsive to a data voltage input and a reference voltage input;
   a third transistor pair comprising an N-type transistor and a P-type transistor operatively connected to respective drain terminals of said second pair of cross-coupled N-type transistors, said third transistor pair having a source terminal and a drain terminal, respectively, coupled to a pull-down node;
   a first input terminal connected to a gate terminal of each transistor in said third pair for receiving said data voltage input;
   a fourth transistor pair comprising an N-type transistor and a P-type transistor operatively connected to the respective drain terminals of said second pair of cross-coupled N-type transistors, said fourth transistor pair having a source terminal and a drain terminal, respectively, connected to the pull-down node; and
   a second input terminal connected to a gate terminal of each transistor in said fourth pair for receiving said reference voltage input, the N-type transistors in each of said third and fourth transistor pairs being on and the P-type transistors in each of said third and fourth transistor pairs being off when said data and reference voltage inputs are above a predetermined level.

2. The sense amplifier of claim 1 wherein the N-type transistors in each of said third and fourth transistor pairs are off and the P-type transistors in each of said third and fourth transistor pairs are on when said data and reference voltage inputs are below a predetermined level.

3. The sense amplifier of claim 2 wherein said third and fourth transistor pairs are both on when said data and reference voltage inputs are within a predetermined range.

4. The sense amplifier of claim 1 wherein each of the P-type transistors in said first pair are in series with one of the N-type transistors in said second pair.

5. A sense amplifier having a pair of output terminals, said amplifier comprising:
   a pull-down node;
   a first pair of transistors connected between said output terminals and said pull-down node and having gate electrodes cross-coupled to said output terminals;
   a second pair of transistors connected between said output terminals and said pull-down node and having gate electrodes coupled to input potentials; and
   a third pair of transistors connected between said output terminals and said pull-down node and having gate electrodes coupled to said input potentials, wherein said second transistor pair is off and said third transistor pair is on when said input potentials are below a predetermined level.

6. The sense amplifier of claim 5 wherein said third and fourth transistor pairs are both on when said input potentials are within a predetermined range.

7. The sense amplifier of claim 5 wherein said first pair of transistors are N-type.

8. A sense amplifier having first and second input nodes and first and second output nodes comprising:

first conductivity means connected between the first output node and a first reference potential and having a conductivity which increases as the potential difference between the first and second input nodes increases; and second conductivity means connected between the second output node and the first reference potential having a conductivity which decreases as the potential difference between the first and second input nodes increases;

wherein said first conductivity means comprises a transistor of a first channel type having its channel connected between the first output node and the first reference potential and its gate connected to the first input node and a transistor of a second channel type having its channel connected between the first output node and the first reference potential and its gate connected to the second input node; and wherein said second conductivity means comprises a transistor of the first channel type having its channel connected between the second output node and the first reference potential and its gate connected to the second input node and a transistor of the second channel type having its channel connected between the second output node and the first reference potential and its gate connected to the first input node.

9. A sense amplifier according to claim 8 further including third and fourth conductivity means connected between the first and second output nodes respectively and the first reference potential and having conductivities which are functions of the second and first output node potentials respectively such that the conductivities increase as the respective output node potentials approach a second reference potential from the first reference potential.

10. A sense amplifier according to claim 9 in which the third and fourth conductivity means comprise a pair of transistors of the first channel type having their channels connected between the first and second output nodes and the first reference potential respectively and their gates connected to the second and first output nodes respectively.

11. A sense amplifier according to claim 8 including pull-up means connected between the output nodes and a second reference potential.

12. A sense amplifier according to claim 11 in which the pull-up means comprises fifth and sixth conductivity means connected between the first and second output nodes respectively and the second reference potential and having conductivities which are functions of the second and first output node potentials respectively such that the conductivities decrease as the respective output node potentials approach the second reference potential from the first reference potential.

13. A sense amplifier according to claim 12 in which the fifth and sixth conductivity means comprise a pair of transistors of the second channel type having their channels connected between the first and second output nodes and the second reference potential respectively and their gates connected to the second and first output nodes respectively.

14. A sense amplifier according to claim 13 in which the first reference potential is ground potential and the second reference potential is a power supply voltage.

15. A sense amplifier according to claim 8 in which the first channel type is N-channel and the second channel type is P-channel.

16. A sense amplifier according to claim 8 including equalizing means for equalizing the potentials of the output nodes.

17. A sense amplifier according to claim 16 in which the equalizing means comprises a transistor having its channel connected between the output nodes and its gate connected to receive an equalizing control signal.

18. A sense amplifier according to claim 8 in which the first reference potential is provided to a reference node via the channel of a control transistor having its gate coupled to receive a control signal.

19. A sense amplifier having first and second output nodes comprising:

a first input node for receiving a first input signal;

a second input node for receiving a second input signal;

first conductivity means responsive to the first and second input signals connected between the first output node and a first reference potential and having a conductivity which increases as the potential difference between the first and second input nodes increases; and second conductivity means responsive to the first and second input signals connected between the second output node and the first reference potential and having a conductivity which decreases as the potential difference between the first and second input nodes increases.

20. A sense amplifier according to claim 19 in which:

said first conductivity means comprises a transistor of a first channel type having a channel connected between the first reference potential and the first output node, and a transistor of a second channel type having a channel connected between the first reference potential and the first output node; and said second conductivity means comprises a transistor of a first channel type having a channel connected between the pull-down node and the second output node and a transistor of a second channel type having a channel connected between a pull-down node and the second output node.

21. A sense amplifier according to claim 19 further including third and fourth conductivity means connected between the first and second output nodes respectively and the first reference potential and having conductivities which are functions of the second and first output node potentials respectively such that the conductivities increase as the respective output node potentials approach a second reference potential from the first reference potential.

22. A sense amplifier according to claim 21 further including fifth and sixth conductivity means connected between the first and second output nodes respectively and the second reference potential and having conductivities which are functions of the second and first output node potentials respectively such that the conductivities decrease as the respective output node potentials approach the second reference potential from the first reference potential.

23. A sense amplifier according to claim 22 in which the first reference potential is ground potential and the second reference potential is a power supply voltage.

24. A sense amplifier according to claim 20 in which the first channel type is N-channel and the second channel type is P-channel.

25. A sense amplifier according to claim 19 including equalizing means for equalizing the potentials of the output nodes comprising a transistor having its channel connected between the output nodes and its gate connected to receive an equalizing control signal.

* * * * *